MULTI-COMPONENT SEMICONDUCTOR NETWORK AND METHOD FOR MAKING SAME

Original Filed Dec. 30, 1966

2 Sheets-Sheet 1

INVENTOR.
Kenneth E. Bean
BY
Robert O. White
ATTORNEY

INVENTOR.
Kenneth E. Bean
BY
Robert D White
ATTORNEY

United States Patent Office
3,740,276
Patented June 19, 1973

3,740,276
MULTI-COMPONENT SEMICONDUCTOR NETWORK AND METHOD FOR MAKING SAME

Kenneth E. Blan, Richardson, Tex., assignor to Texas Instruments Incorporated, Dallas, Tex.

Original application Dec. 30, 1966, Ser. No. 606,198. Divided and this application Aug. 24, 1970, Ser. No. 66,646
Int. Cl. H01l 7/36
U.S. Cl. 148—175 5 Claims

ABSTRACT OF THE DISCLOSURE

A process is disclosed for fabricating a multi-component network utilizing a body of high resistivity semiconductor material. The process includes selectively etching the semiconductor substrate and reforming it by epitaxial deposition of semiconductor material having different impurity concentration or conductivity type. The process provides improved isolation junctions between the various components of the network enabling high switching speeds.

This application is a divisional of application Ser. No. 606,198 filed Dec. 30, 1966, now abandoned.

My invention relates generally to multi-component networks of semiconductor devices which are capable of switching speeds substantially higher than those presently obtainable, and methods of fabrication thereof. More specifically, the invention is directed to the provision of isolating junctions of improved effectiveness between the various elements of multi-component networks or integrated circuits, such junctions being characterized by high breakdown voltages and low capacitances.

In the development of that phase of semiconductor technology concerned with multi-component devices within unitary bodies, it has been found that the inability to effectively isolate the various components from each other so as to prevent undesirable inter-action among them has imposed a significant limitation on the switching speed. Although others have recognized that the failure to provide effective isolation among the circuit components was a major factor in this area, they have failed to develop a method for fabricating such circuits which is consistent with the requirements of economy, large scale production and compatibility among the various fabrication steps employed.

Multi-component devices such as integrated circuits customarily are fabricated within a body of a semiconductor material by a series of steps, all or most of which are accomplished from the same surface of the body for reasons of convenience and economy. A high degree of control over the conductivity type, depth and lateral extent of the various regions which form the circuit components is required, to which end diffusion methods for establishing conductivity characteristics and oxide masking techniques for geometrical control of diffusion patterns have been developed. However, the fact that the major part of the fabrication process is carried out from one surface of the semiconductor body, coupled with the fact that all or most of the fabrication steps involve diffusion of an appropriate impurity into the substrate from such surface, limits the performance characteristic of the resulting devices.

Presently available techniques are such that one having no concern with economy undoubtedly could fabricate multi-component devices in which substantially complete isolation between components was achieved. However, such devices would be commercially impractical for most purposes, so the present invention has as its primary object the achievement of a practical and economical method of fabricating high switching speed circuits through eminently effective and wholly compatible steps leading to the formation of better isolating barriers than heretofore have been devised.

Although most of the present processes for fabricating multi-component devices involve a series of successive masking and diffusion steps which alter the characteristics of selected regions of the substrate body, there recently have been developed some practical techniques for etching a zone of a desired shape and size within the substrate, and then reforming it by epitaxial deposition, appropriate impurities being introduced during the reformation process so as to create layers of any desired conductivity characteristics consistent with the requirements of the components being fabricated. Such etch-and-deposit methods, as applied in the manner detailed hereinafter, are particularly suitable for achieving the objects of my invention, another of which can be defined as the application of an etch-and-deposit method to the fabrication of high switching speed circuits or networks.

It also is an object of my invention to provide better and more effective isolation between the individual components of a multi-component device, without increasing the number of steps involved in the fabrication of such device to an extent which renders the process economically impractical or adversely affecting the characteristics of such components.

It is a more specific object of my invention to provide better isolation in multi-component devices by employing for such purpose junctions between high resistivity material of opposite conductivity types, rather than the conventional junctions between regions at least one of which is of relatively low resistivity.

In accordance with the principles of my invention, the foregoing and other objects are achieved in a device in which a region of semiconductor material of one conductivity type and relatively high resistivity is made to adjoin a region of relatively high resistivity material of the opposite conductivity type. The junction therebetween offers desirable characteristics for isolation purposes, including high breakdown voltage and low capacitance, and it thus provides an extremely effective barrier between the regions in which the operative components of the network or circuit are formed. More particularly, whereas prior devices have been capable of switching speeds measured under the best of circumstances in nanoseconds ($10^{-9}$ seconds), the effective isolation provided by my invention is capable of achieving switching speeds measured in fractions of nonoseconds, approaching picoseconds ($10^{-12}$ seconds).

In the regions bounded by isolating junctions, circuit components as required may be fabricated through the proper utilization of a series of individual steps, each of which has found some application in this field of technology in the past. These and other particulars of my invention are set forth in detail hereinafter, and illustrated by the attached drawings in which.

Figure 1:
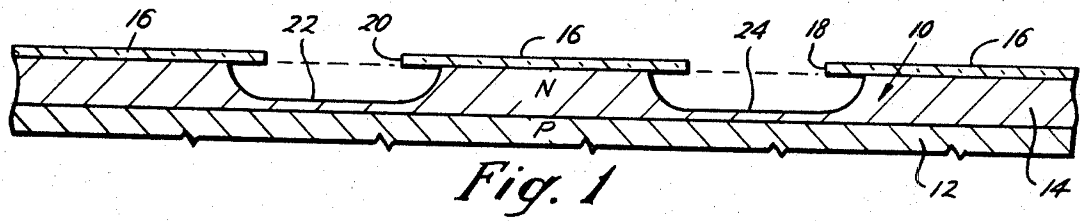
FIG. 1 is a sectional view of a portion of a body of semiconductor material in which two pockets or moats have been etched.

Referring now to FIG. 1, reference numeral 10 identifies generally the body of semiconductor material which has been subjected to the initial phase of my process. It is to be understood that my invention finds primary utility in the fabrication of so-called integrated circuits or multicomponent networks, and that for purposes of illustrating the principles thereof, it is sufficient to show only a portion of the body of material in which such a device is to be fabricated. Thus, the body 10 may be of substantial size, and provide space for the fabrication of any desired number of individual circuit components.

In bringing the body 10 to the condition shown by FIG. 1, a substrate 12 of high resistivity P type material first was provided with an overlying layer 14 of high resistivity N type material by a conventional process of epitaxial deposition. For purposes of accomplishing the objects of my invention, relatively high resistivity material normally would have a resistance of from 10 to 15 ohm-centimeters and under some circumstances it could be higher.

The substrate 12 with its epitaxially deposited layer 14 then was covered by a suitable mask 16, having apertures or windows 18 and 20 therethrough. The techniques for forming such masks and removing portions thereof for exposure of the semiconductor material therebelow are well known in the art, and require no description here.

By exposing the partially masked body of semi-conductor material to an etchant, as for example hydrogen chloride vapor, the material below the windows 18 and 20 was attacked and removed to form the pockets or moats identified respectively by reference numerals 22 and 24. It will be noted that the etchant attacked the semiconductor material uniformly so that the pockets extend under the masking layer 16 adjacent to the windows 18 and 20. My experience has indicated that the epitaxial layer 14 may be approximately 10 microns thick, in which event it is sufficient to etch a pocket approximately 6 microns deep.

The foregoing steps produced the body 10 of FIG. 1. The next step involves the reformation of the pockets 22 and 24 by epitaxial deposition to complete the two phase operation from whence the phrase etch-and-deposit is derived.

Figure 2:
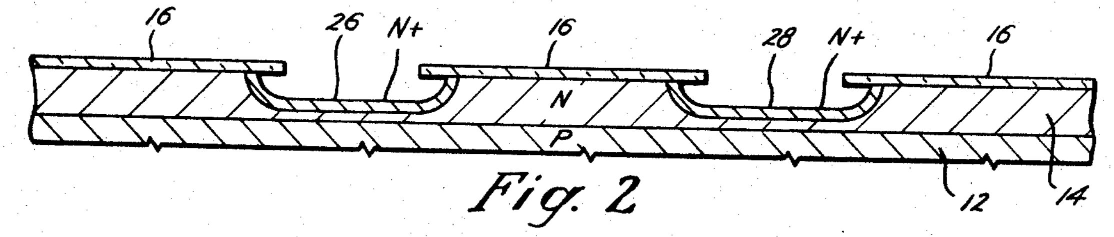
FIGS. 2 through 6 are sectional views of the body of material of FIG. 1, illustrating sequential steps in my process culminating in the complete device, a portion of which is illustrated in FIG. 6.

FIG. 2 illustrates the condition which follows the epitaxial deposition of approximately two microns of relatively low resistivity (heavily doped) material, the expression N+ being used to denote this type of material. A resistivity range of 0.018 to 0.020 ohm-centimeter would be typical. The layers of N+ material identified by reference numeral 26 in pocket 22 and reference numeral 28 in pocket 24 follow the contours thereof, and are substantially uniform in thickness. It will be noted that a portion of layers 26 and 28 comes to the original level of the upper layer 14 under the masking layer 16.

Figure 3:
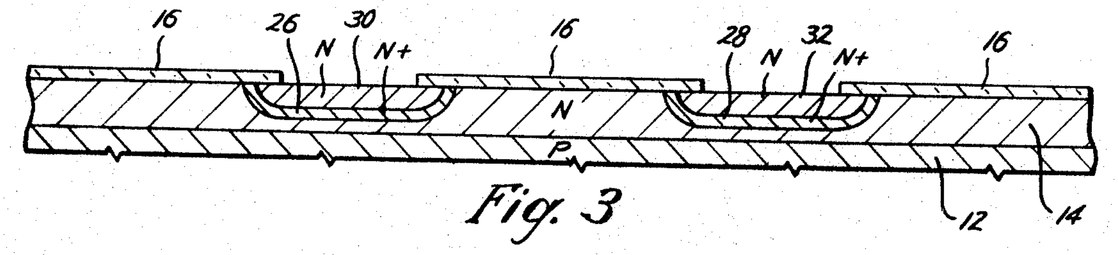

After formation of the layers 26 and 28, the amount of impurity in the reactant stream from which epitaxial deposition is occurring can be reduced, so as to restore the pockets 22 and 24 to substantially the original level of the layer 14 with less heavily doped N type material. A typical process might involve resistivities ranging from 0.18 to 0.22 ohm-centimeter. The resulting regions 30 and 32 as shown in FIG. 3 may be used in the formation of any desired components, and for purposes of illustration, the method as described herein will show one manner in which a transistor may be formed in region 30, and a resistor in region 32.

With respect to the transistor to be formed in the region 30, it should be noted that the purpose of the underlying N+ region 26 is to provide a low resistance path to the collector contact. The need therefore is well understood, and an arrangement of this type customarily is provided. Hence, no further explanation is required here.

Figures 4, 5:
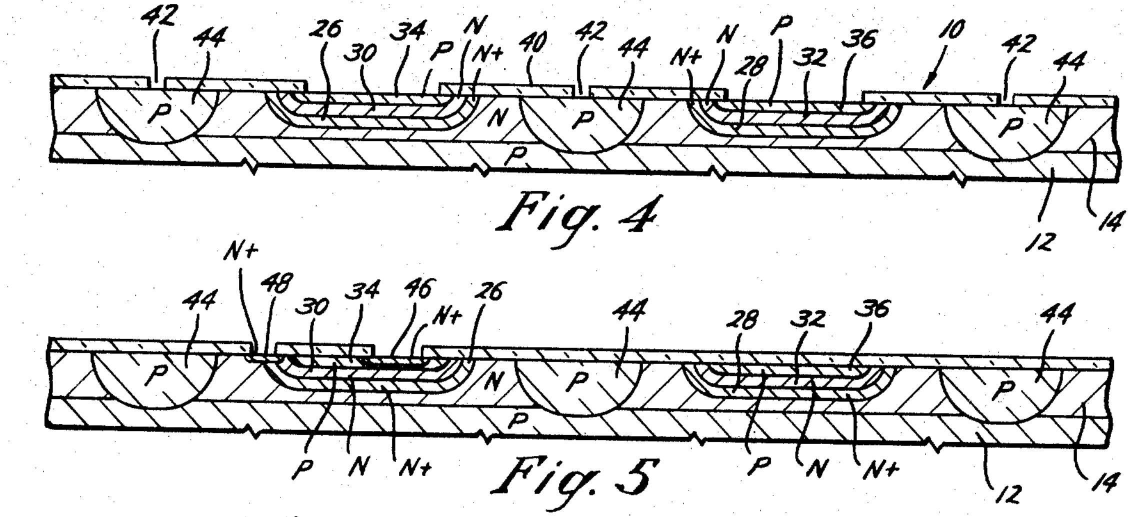

FIG. 4 illustrates the next step in the sequence of fabrication. The P region 34 which is to form the base of the transistor in the region 30, and the P region 36 which is to be employed as a resistor are established by the selective diffusion of an appropriate impurity through a window in the oxide layer overlying the body of material. Such a diffusion step is quite conventional in the art, and it need be noted only that the first masking layer 16 has been removed in the customary way and reformed with a new pattern of apertures, the new masking layer being identified by reference numeral 40, and having apertures 42 therethrough in addition to those overlying the P regions 34 and 36.

The purpose of the apertures 42 is to provide barriers to isolate the circuit components from each other laterally. As the epitaxial layer 14 is of N type material, a zone of P type material extending to the P type substrate 12 is required. However, as the layer 14 is but lightly doped, only a small amount of P type impurity is needed to achieve a reversal of conductivity type, and the resistivity need not be significantly reduced. Thus the resulting junction will have the desired characteristics of a high breakdown voltage and low capacitance. Reference numeral 44 identifies the P type isolation zones below the apertures 42.

The diffusion of P type impurities to establish the zones 44 may be accomplished at the same time the regions 34 and 36 are formed. However, it should be noted that P type impurities would diffuse much more rapidly into the lightly doped N type layer 14 than into the N type regions 30 and 32, the latter being of substantially higher impurity concentration, so it might on occasion be advisable to accomplish at least a portion of the diffusion step required to form regions 34 and 36 before opening the apertures 42.

Figure 6:
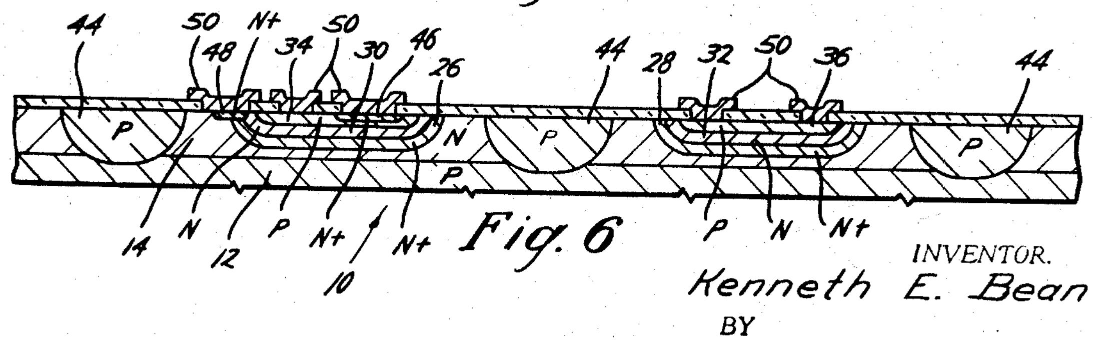

The steps required for completing the components chosen to illustrate my invention are conventional, involving the removal and reformation of the oxide mask so as to confine the final N type diffusion to the small region 46 chosen for the emitter of the transistor, and, if necessary or desirable, to a small region 48 adjacent the N+ region 26 underlying the collector 30 of the transistor for making the collector contact. It will be noted that the region 36 is masked during the formation of the emitter 46 and collector contact 48. The oxide mask and apertures for this final diffusion step are shown in FIG. 5, and FIG. 6 illustrates the completed device, with deposited contacts 50 of the conventional type interconnecting the elements.

Figure 7:
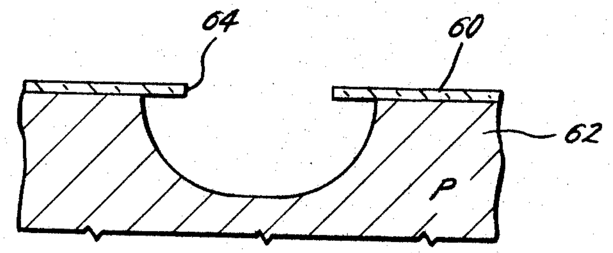
FIGS. 7 through 9 illustrate the sequential steps in an alternate method for fabricating a multi-component device embodying the principles of my invention.
Figure 8:
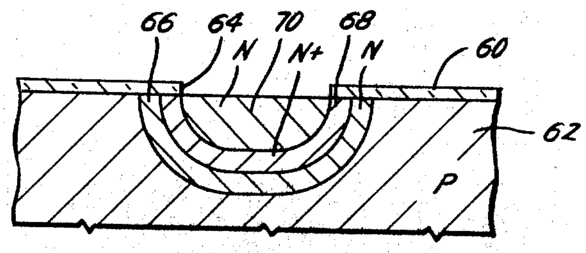
Figure 9:
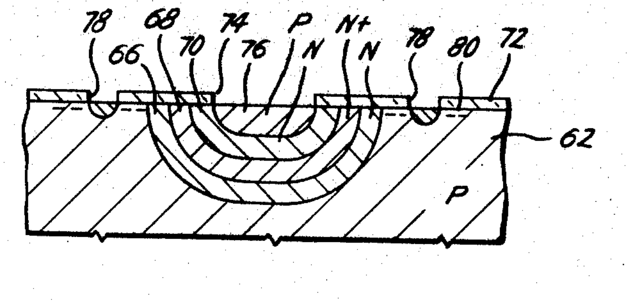

The principles of my invention can be employed in another manner, as illustrated in FIGS. 7 through 9. Although these figures show only the part of a body of semiconductor material in which a transistor is fabricated, it is to be understood that other components will be fabricated elsewhere therein.

Rather than using a body of material having an epitaxially deposited layer of N type material overlying a P type substrate, the beginning material can be high resistivity (10–15 ohm-centimeters) P type. First a mask 60 is formed over the substrate 62, with an aperture 64 overlying the region in which a circuit element is to be formed. Then, a selective etch-and-deposit operation may be accomplished, in which the P type material first is removed to a substantial depth, for example 10 microns. Thereafter the pocket thus formed is refilled by epitaxially depositing N type material 66, then N+ material 68, and finally N type material 70, to achieve the condition of FIG. 8. The first N region 66 is to establish the isolating junction adjacent to the P type substrate, so it will have a very low impurity concentration and a correspondingly high resistivity. The other two layers 68 and 70 are analogous to regions 26 and 30 in the example shown in FIGS. 1 through 6, and will be of comparable resistivity.

FIG. 9 illustrates the next step, in which the oxide mask 60 has been removed and replaced by another mask 72 which is patterned to permit the diffusion of impurities through aperture 74 into region 70 to establish the base 76 of the transistor. At the same time an appropriately shaped opening 78 is provided through the mask 72 so P type impurities can be diffused into the substrate 62 near the surface thereof. This step may not be necessary in every case, but there sometimes is a tendency for an N type region to be formed immediately under the mask (such region being shown by a broken line and identified by reference numeral 80 in FIG. 9), and the diffusion through opening 78 would be an appropriate precautionary measure.

The steps required to complete the transistor of FIGS. 7 through 9 are the same as those shown and described in connection with FIGS. 5 and 6. An additional masking and diffusion step to form the emitter and, if desired, the collector contact zone, followed by the depositing of appropriate leads, will complete the process.

It will be noted that this alternate method provides a means for avoiding the initial epitaxial deposition of a layer 14 as in the first-described method, but requires a more complex series of steps for reforming the material within the etched zone. There also is a variation in the alternate method which may on occasion offer some advantages, such variation involving the conversion of the P type substrate to high resistivity N type material in selected regions by an initial diffusion step through a mask. Thereafter the desired components would be fabricated within such N regions by the process of FIGS. 1 through 6.

This variation will produce a graded junction between the substrate and the diffused N regions which junction normally would be less satisfactory for isolation purposes than that created by epitaxial deposition atop the body or the etch-and-deposit method. However, if this slight loss of barrier effectiveness is acceptable, some economy could be achieved.

As described above in its presently preferred form, my invention involves selectively etching the semiconductor substrate, and thereafter reforming it by epitaxial deposition of material having a different impurity concentration or conductivity type. It is desirable to use a process which converts from an etching condition to a depositing condition as quickly and conveniently as possible, and this consideration suggests a reversible reaction.

The basic formula for one such reaction is $SiCl_4+2H_2 \rightleftharpoons 4HCl+Si$. This reaction is forced to the left by the addition of a sufficient excess of HCl, thus creating an etching condition. To change from the etching condition to one in which there is deposition of silicon requires only a decrease or termination of the flow of hydrogen chloride. The silicon will adopt the crystalline orientation of the substrate if various conditions well known in the art are maintained.

Figure 10:
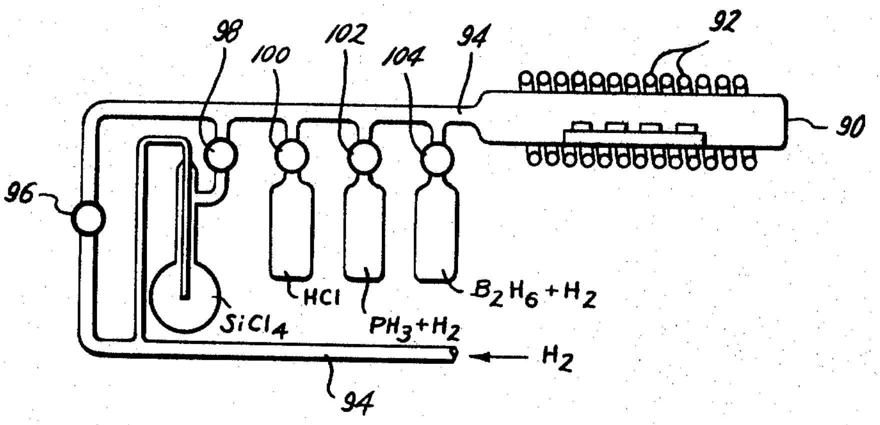
FIG. 10 is a schematic drawing of apparatus which may be used in conjunction with my process.

FIG. 10 illustrates apparatus suitable for utilizing this reaction in the practice of my invention. A reactor in the form of a tube furnace 90 is heated by coils 92. The furnace may be of a horizontal or vertical type, it may be adapted for single or multiple substrate slices, and it may be heated by conventional means, including resistive or inductive heating.

The silicon bodies are disposed within the furnace in such position as to be exposed to gases arriving through the conduit 94. Purified and dried hydrogen is used as the carrier gas, and it is introduced from a suitable source at the end of the conduit 94. A valve 96 controls the rate of hydrogen flow through this conduit. Silicon tetrachloride vapor is introduced to the conduit 94 by bubbling the hydrogen gas through the liquid compound contained in a flask as shown. The hydrogen chloride vapor is introduced to the conduit 94 from a cylinder containing anhydrous HCl also as shown. The flow rates of the gases are controlled by conventional valves 98 and 100 in addition to valve 96.

The rate of etching is determined by a number of parameters, including the temperature, flow rate and composition of the etchant vapors. The silicon dioxide acts as a mask to the etching to allow the preferential etching of the silicon.

In using the apparatus of FIG. 10, suitable dopants may be introduced through compounds such as arsine ($AsH_3$) for N type doping, or diborane ($B_2H_6$) for P type doping. These or other suitable doping compounds may be stored in cylinders mixed with hydrogen gas as indicated in FIG. 10. The concentration of the doping materials in the reactant stream, and thus the impurity concentration in the epitaxially regrown layers, may be adjusted by the valves 102 and 104.

It should be noted that the principal objects of my invention are accomplished by the provision of adjoining regions of high resistivity material of opposite conductivity types. Junctions therebetween offer the isolating characteristics which result in previously unobtainable switching speeds for devices so separated, and the methods by which the devices themselves are formed are of less importance. Thus, although the foregoing description of the presently preferred manner of practicing my invention utilizes the so-called etch-and-deposit technique, it is to be understood that other conventional methods of fabricating circuit devices within a region of semiconductor material, such as those involving controlled mask-and-diffusion steps, also may be employed on occasion.

Having described my invention along with certain variations which may not be readily apparent, I set forth below the claims which are intended to protect such invention and variations, together with additional variations which would occur to one skilled in the art.

What is claimed is:

1. The method of fabricating a multicomponent network utilizing a body of high resistivity semiconductor material of one conductivity type which comprises:
epitaxially depositing upon the body a first layer of semiconductor material of substantially equal resistivity and opposite conductivity type;
etching a plurality of pockets within the first layer;
epitaxially depositing a second layer of low resistivity semiconductor material of the same conductivity type as the first layer within said pockets;
epitaxially depositing within said pockets atop the second layer a third layer of semiconductor material of the same conductivity type and having a resistivity suitable for the fabrication of network components therein; and
fabricating and interconnecting a plurality of semiconductor components, each within a selected region of the third layer, by selective introduction of appropriate impurities through patterned masks, and the formation of circuit leads.

2. The method of claim 1 in which the second and third epitaxial layers substantially reform the first epitaxial layer to its initial conformation whereby each of the former extends to the upper surface thereof.

3. The method of claim 1 in which impurities are introduced into the first epitaxial layer to reverse the conductivity type thereof in regions intermediate the etched and refilled pockets during the introduction of impurities into the third layer for the formation of junctions therein having component functions.

4. The method of fabricating a multi-component network utilizing a body of high resistivity semiconductor material of one conductivity type which comprises:
diffusing impurities into the body from the upper surface thereof to reverse the conductivity type but not significantly reduce the resistivity thereof in a layer of substantially uniform depth;
etching a plurality of pockets within the layer of reversed conductivity type;
epitaxially depositing a layer of low resistivity semiconductor material of the same conductivity type as the reversed layer within each of said pockets;
epitaxially depositing a second layer of semiconductor material to substantially reform each of the pockets, the second layer being of the same conductivity type as the first layer and of a resistivity suitable for the fabrication of circuit components therein;

diffusing impurities into selected portions of the reversed layer intermediate the etched and reformed pockets to restore the conductivity type thereof to that of the body, without significantly reducing the resistivity thereof; and fabricating and interconnecting a plurality of semiconductor components within the etched and reformed pockets by selective diffusion of appropriate impurities through patterned masks, and the formation of circuit leads.

5. The method of claim 4 in which the diffusion of impurities into selected portions of the reversed layer to restore the conductivity type of the body is accomplished during the diffusion of impurities into the etched and reformed pockets for the formation of junctions therein having component functions.

References Cited

UNITED STATES PATENTS

| | | | |
|---|---|---|---|
| 3,460,006 | 8/1969 | Strull | 317—235 |
| 3,327,182 | 6/1967 | Kisinko | 317—235 |
| 3,370,995 | 2/1968 | Lowery et al. | 148—175 |

CHARLES W. LANHAM, Primary Examiner

W. TUPMAN, Assistant Examiner

U.S. Cl. X.R.

29—580, 578; 148—187